United States Patent

Fuchs et al.

[11] 4,412,641
[45] Nov. 1, 1983

[54] DESOLDERING APPARATUS

[75] Inventors: Gottfried Fuchs, Dorfprozelten; Ewald Garrecht, Wertheim-Sachsenh.; Lothar Rieck, Wertheim; Wolfgang Rüppel, Kreuzwertheim-Röttbach; Rudolf Schwarz, Schwieberdingen; Erich Siegle, Eberdingen-Hochdorf, all of Fed. Rep. of Germany

[73] Assignee: Ersa Ernst Sachs GmbH & Co. KG, Wertheim am Main, Fed. Rep. of Germany

[21] Appl. No.: 302,077

[22] Filed: Sep. 14, 1981

[30] Foreign Application Priority Data

Oct. 23, 1980 [DE] Fed. Rep. of Germany ....... 3040274

[51] Int. Cl.³ .............................................. B23K 3/00
[52] U.S. Cl. ..................................... 228/37; 228/191; 228/56; 118/406
[58] Field of Search ............... 228/20, 39, 37, 191, 228/56 B, 119, 264; 118/406, 410, 411, 504, 505

[56] References Cited

U.S. PATENT DOCUMENTS

| | | | |
|---|---|---|---|
| 3,815,806 | 6/1974 | Paxton | 228/56 A |
| 3,834,605 | 9/1974 | Coffin | 228/20 |
| 3,948,212 | 4/1976 | Mayer | 228/20 X |
| 4,066,204 | 1/1978 | Wirbser et al. | 228/20 X |
| 4,162,034 | 7/1979 | Pavlas | 228/20 X |
| 4,187,973 | 2/1980 | Fortune | 228/20 |

Primary Examiner—Nicholas P. Godici
Assistant Examiner—M. Jordan
Attorney, Agent, or Firm—Max Fogiel

[57] ABSTRACT

A device for desoldering electronic components from circuit boards has a soldering nozzle which produces a solder wave that is directed from below the circuit board against the component to be desoldered; thereby dissolving previous solder bonds. The component can then be lifted out from above and suction is applied from below to the now-opened bores of the circuit board, to remove residual solder from them. A new component can then be installed, using the same equipment.

6 Claims, 6 Drawing Figures

DESOLDERING APPARATUS

BACKGROUND OF THE INVENTION

The present invention relates to a desoldering apparatus.

More particularly, the invention relates to an apparatus for desoldering electronic components from electrical circuit boards and the like. The purpose of devices of this type is to remove incorrectly soldered or defective electronic components so that they can be replaced. As a general rule, this type of equipment also is capable of installing—i.e. soldering in place—a new component.

In a known device of the type in question a soldering nozzle accommodated to the dimensions of the component to be desoldered supplies liquid solder to the underside of the circuit board. When all solder connections holding the components to the circuit board have been melted open, the component can be removed, for which purpose it is pulled upwardly out of the circuit board, either manually or by means of a suitable tool engaging its terminals or the like. Thereupon, an air nozzle is placed from above into the free space left by the removal of the component and by means of a slight overpressure the bores in the circuit board are blown free in downward direction, so that residual liquid solder is blown downwardly into the solder nozzle. The air nozzle has the inner dimensions as the solder nozzle and at the same time serves for positioning, because it agrees with the arrangement of the solder nozzle located beneath the circuit board.

To install a new component it is placed into the now free bores of the circuit board and is soldered to the conductors of the circuit board by means of a wave of liquid solder which is emitted from the solder nozzle.

A disadvantage of this known device is the fact that the circuit board often has components mounted on it in such very close relationship that there is no place for the air nozzle which is to be positioned. Further, if the dimensions of the electronic components to be removed change from one place to another on the circuit board, then both the air nozzle and the solder nozzle must also be exchanged because they are both closely accommodated to the dimensions of the electronic components to be removed. Finally, the time between the removal of the disengaged electronic components from the circuit board and the blowing-open of the bores in the circuit board by means of the air nozzle is relatively long, because the air nozzle cannot be put in place until after the removal of the desoldered electronic component. This relatively large time requirement is disadvantageous for a rapid working relationship, and in particular there is the danger that some of the liquid solder in the bores might already have set and can no longer be blown out of the bores by the air from the air nozzle.

SUMMARY OF THE INVENTION

Accordingly, it is a general object of the invention to overcome the disadvantages of the prior art.

A more particular object of the invention is to provide an arrangement for desoldering electronic components from circuit boards and also for re-soldering new components into a circuit board, in which the number of elements to be exchanged in accommodation to changes in the size of electronic components to be desoldered, is kept as small as possible.

Another object of the invention is to provide such an arrangement in which the device for removal of residual solder from the bores of the circuit board is so constructed that no space problems occur even though components are closely adjacently mounted on the circuit board.

Still a further object of the invention is to provide such an arrangement in which the time required for removal of a desoldered component and the removal of residual solder from the bores of the circuit board, is as short as possible.

In pursuance of these objects, and of still others which will become apparent hereafter, one feature of the invention resides in a device for desoldering of electronic components from circuit boards which, briefly stated, comprises means defining an under-pressure space at the lower side of the conductor board; means accommodated to the dimensions of the component to be desoldered and removably defining an inlet opening to the under-pressure space; and opening means in the second-mentioned means forming a delimination for a solder wave issuing from a solder nozzle from below the second means and arranged with spacing thereto.

By the arrangement of the device for the removal of solder residue from the bores of the conductor board, at the underside of the circuit board, and by constructing it as a suction space with the suction opening in form of an insert part accommodated to the dimensions of the component to be removed, and finally with the use of this insert part as a delimitation for the solder stream which issues from the solder nozzle arranged with spacing below the insert part, it is made possible for only a single element—namely the insert part—to carry out the function of the solder nozzle and at the same time of the air nozzle heretofore required in the prior art.

Furthermore, this arrangement permits the dimensions of this insert part—although they are accommodated to the dimensions of the electronic component—to be independent of whether and which space is present at the upper side of the circuit board between the other components located thereat.

Finally, only a short time is required to elapse between the removal of the desoldered electronic component and the application of suction for the removal of residual solder from the now open bores of the circuit board.

According to a currently preferred embodiment of the invention it is advantageous if the insert part is located within a replaceable mask insert. To accommodate the device to other dimensions of an electronic component to be desoldered it is simply necessary to replace the mask insert with the insert part forming the suction opening. For simple marking of the electronic component to be desoldered a marking projector may be provided above the mask insert for the insertion of marking pictures, the projection of which onto the circuit board indicates the electronic component to be removed by desoldering.

The invention will hereinafter be described with reference to an exemplary embodiment illustrated in the drawing. However, it should be understood that this is for purposes of explanation only and that the details of the drawing are not to be considered limiting on the scope of the appended claims.

DESCRIPTION OF THE PREFERRED EMBODIMENTS

Figure 1:
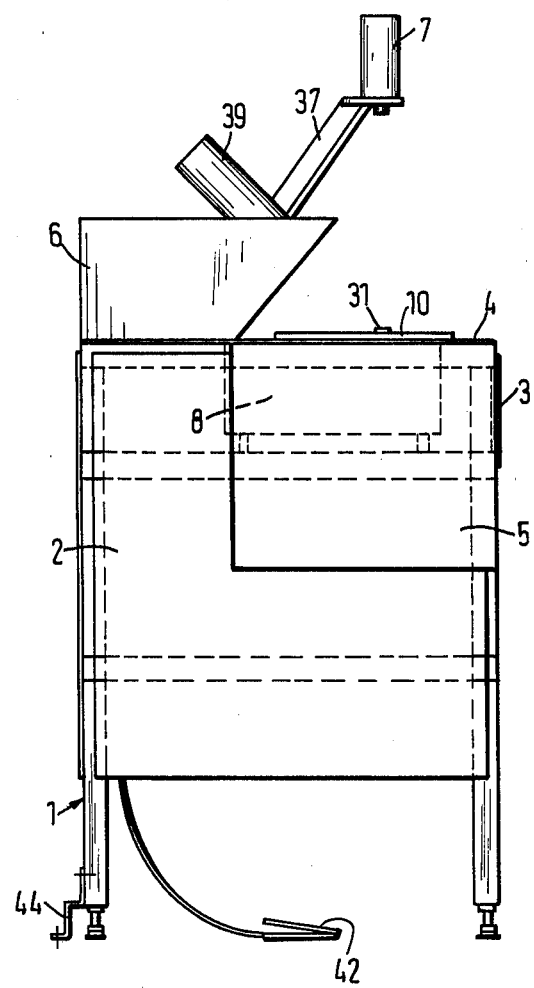
FIG. 1 is a side view of a device according to the present invention.
Figure 2:
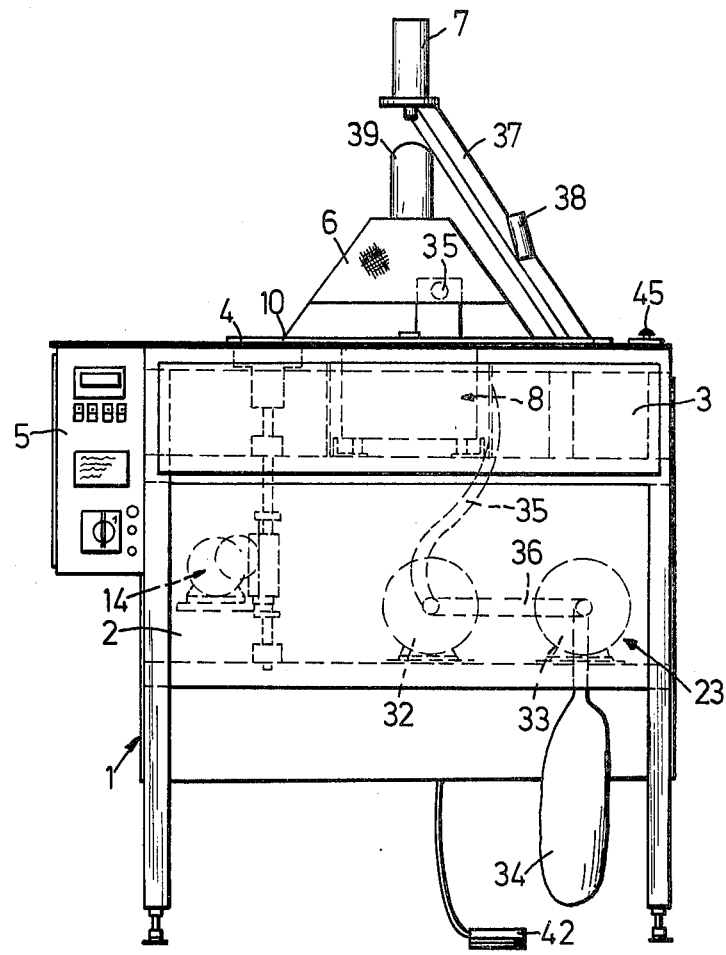
FIG. 2 is a front view thereof, with additional elements shown in broken lines.

Referring now to the drawing in detail it will be seen that reference numerals 1–6 identify an exemplary embodiment of the invention, of a device for desoldering of electronic components from circuit boards. This device has a four-legged frame 1 surrounded by sheet metal cladding 2, heat shield 3 on the operating side, a working plate 4 with an electrically conductive cover, a switching console 5 with an electronic control, a suction device 6 arranged above the working plate 4 and a marking projector 7. A guide baffle 44 assures the MOS safety of the working plate 4. An emergency-off switch 45 is arranged within the reach of the operator at the working plate 4.

Figure 4:
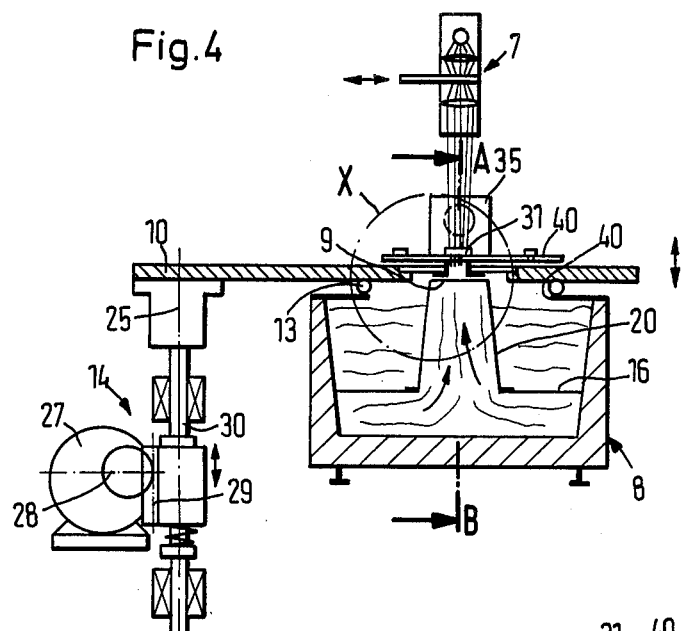
FIG. 4 is a section in principle through the essential components of the device in FIGS. 1–3.
Figure 5:
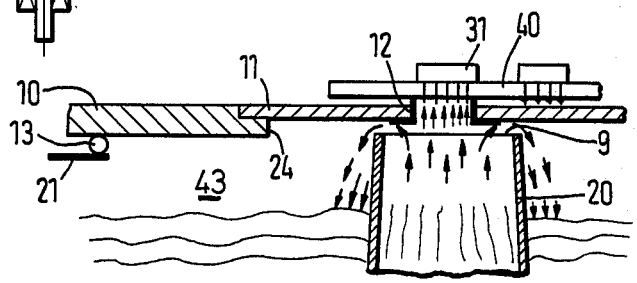
FIG. 5 is an enlarged detailed view showing the detail X in FIG. 4.
Figure 6:
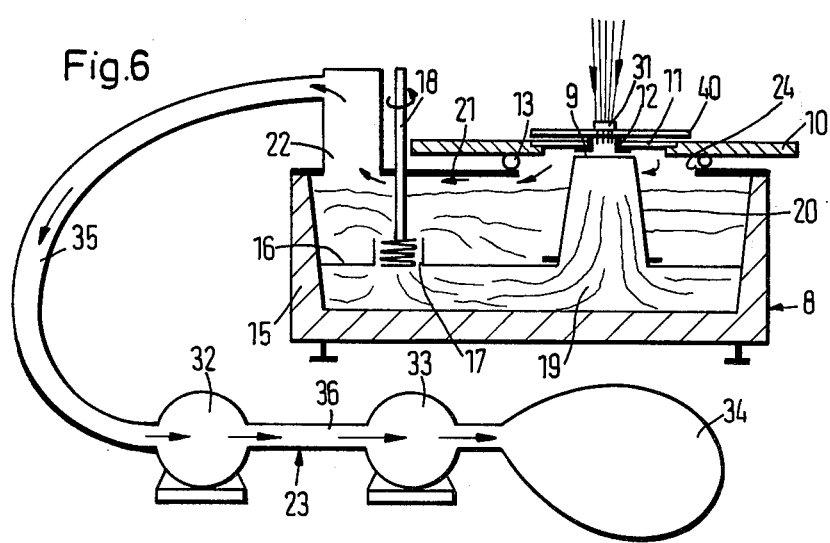
FIG. 6 is a section taken on line A-B of FIG. 4.

In the plane and below the working plate 4, between the claddings 2 of the frame 1, the actual components are arranged as shown in FIGS. 4–6 in more detail. These comprise a soldering device 8 with a soldering nozzle 9, a masking frame 10 that can be raised and lowered in the plane of the working plate 4 and serves to receive masking inserts 11 with insert parts 12, a seal 13 between the upper delimitation surfaces of the housing 15 of the soldering device 8 and the underside of the masking frame 10, and a raising and lifting mechanism 14 for the masking frame 10.

The soldering device 8 is composed of a heat-resistant and heat-insulated housing 15 the interior of which is subdivided by a horizontal wall 16. This has a solder inlet opening 17 with a rotary screw pump 18 and a further opening 19 which is followed by a conduit 20 which at the top communicates with the soldering nozzle 9. The latter has a constant cross-section, particularly a rectangular cross-section, which is greater than the dimensions of the largest electrical component to be desoldered. The pump pushes the liquid solder located above the walls 16 through the conduit 20 upwardly and so that it issues from the nozzle 9 as a solder wave as indicated particularly in FIG. 5 by the arrows. The housing 15 of the device 8 is gas-tightly closed at the top by a cover plate 21 having a connecting opening 22 for a suction device 23 and a working opening 24 which is penetrated by the conduit 20 of the solder nozzle 9. Around this working opening 24 the seal 13 is arranged which heremetically closes the air space located above the solder bath within the housing 15 of the solder device 8, as soon as the raisable and lowerable masking frame 10 is put in place.

The masking frame 10 is turnable immediately above the plane of the working plate 4 about a pivot bearing 25 with a vertical axis and in its working position engages a guide prism 26 which is mounted above the working plate 4 at the same. The masking frame 10 is of epoxy resin. It can be vertically raised by means of the raising and lowering mechanism 14 which is composed of a drive motor 27 in form of a rotary current transmission brake motor, a pinion shaft with a pinion 28 and a rack 29 which is mounted on a vertical shaft 30 which guides the mask frame 10 and which is pivotably and vertically movable to and fro within the frame 1.

The mask frame 10 which is sealed by means of the seal 13 relative to the housing 15 or to the soldering device 8 when it is in lowered condition, carries within an opening removably inserted mask inserts 11 which are also of epoxy resin. These in turn have within an opening the insert part 12 which is of steel and on the inside coated with soft iron. The mask insert 11 with the insert part 12 is, even in the lowered condition of the mask frame 10 located above and at a spacing from the soldering nozzle 9 of the soldering device 8. The insert part 12 is accommodated to the dimensions of the electronic component 31 to be desoldered and which is located immediately above the surface of the mask insert 11 within the confines of the wall parts of the mask insert 12 which project above the mask insert 11.

Within the frame 1 there is arranged, between the claddings 2, the suction device 23 which is composed of two sequentially arranged blowers 32, 33 and a thereafter following dust bag 34 for removal of residual solder, with metallic suction conduits 35, 36 being connected between the connection opening 22 of the housing 15 and the blowers 32, 33.

The marking projector 7 which is mounted above the woring plate 4 on a support 37, can be provided with removable marking pictures the light symbols of which direct a fixed picture upon the mask insert 11 and the insert part 12 thereof, whereby the component 31 to be desoldered, respectively a component to be re-soldered in its place, are marked. A flux container 38 is arranged on the support 37.

The suction arrangement 6 which is still provided above the working plate 4 serves for removal of deleterious vapors into a conduit net which is connected with an exhaust nipple 39.

The control console 5 is mounted on the frame 1 and includes a complete electronic control for carrying out of all operations, namely desoldering as will hereafter be described, and for re-soldering.

Figure 3:
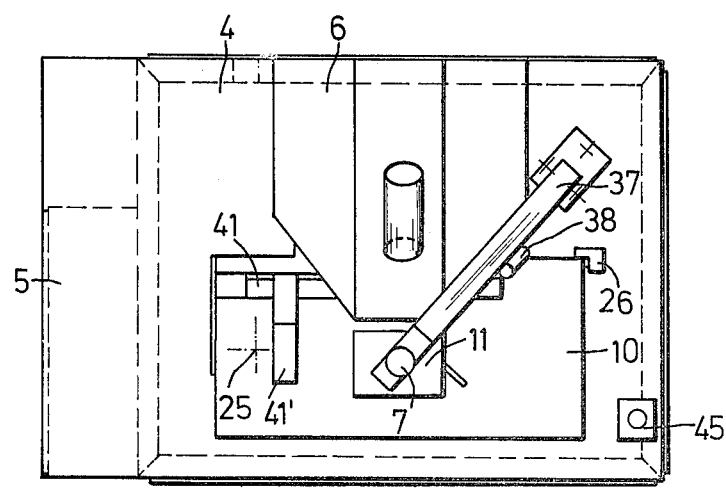
FIG. 3 is a top-plan view of the device in FIGS. 1 and 2.

For an operation for desoldering of an electronic component 31 from a circuit board 40 it is first necessary to heat the solder bath within the solder device 8, for which purpose the latter is provided with heating devices which are not described and illustrated in detail because they are known per se. As soon as the solder wave issues from the solder nozzle 9 in the form indicated in principle by the arrows in FIG. 5, desoldering can be begun. For this purpose flux from container 38 is applied upon the desoldering range of circuit board 40 and the circuit board 40 is placed with the component legs facing upwardly upon the mask frame 10 respectively the mask insert 11, with abutments 41, 41' (see FIG. 3) assuring an exact positioning. The component 31 to be desoldered is now located above the circuit board 40 and is marked by the picture projected by the marking projector 7. A not-illustrated removing tool is placed upon the component 31 to be desoldered and a foot switch 42 is operated, whereupon the masking frame 10 is lowered under the influence of the mechanism 14. As a result of this the under-pressure space 43 within the solder bath and within the soldering device 8 is sealed by means of the seals 13, and also the soldered component legs of the component 31 to be desoldered now move into the range of the solder wave issuing from the soldering nozzle 9, so that previously made soldering connections are now melted open.

At the same time, a timer in the electronic circuit of the console 5 is started for shutting down the solder wave automatically. The mask frame remains in its lower position and solder from the solder wave runs over the legs of the component until the previous soldering connections have melted open. Thereupon the component 31 is lifted by hand, using a suitable tool or by means of a not-illustrated suitable device, out of the circuit board 40. As soon as the timer for the desoldering period has timed out, the soldering wave is switched off and the suction device 23 is switched on, which is again timed by a suitable timer. The openings in the circuit board 40, which have been opened up by a removal of the legs of the separated component 31, can now be immediately freed of residual liquid solder by the under-pressure applied to them. As soon as the timer for suction device 23 has timed out, the mask frame 10 is raised and the solder wave 10 is switched back on again. A new component 31 can now be put in place and can be soldered in place by lowering the mask frame 10.

If a change takes place in the size of the components to be desoldered, then only the mask insert 11 with the insert 12 need to be removed and to be replaced with a new mask insert 11 and insert part 12 which are accommodated to the dimensions of the new component 31. Thereupon, the next operation can immediately begin.

What is claimed is:

1. Apparatus for desoldering electronic components from conductor boards, including a solder nozzle at the lower side of the conductor board and an arrangement for the removal of residual solder from the bores of the conductor board, comprising in combination: a second means defining a sub-atmospheric pressure space at the lower side of the conductor board; means accommodated to the dimensions of the component to be desoldered and removably defining an inlet opening to the sub-atmospheric pressure space; and opening means in the second means forming a delimitation for a solder wave issuing from said solder nozzle from below the second means.

2. Apparatus according to claim 1, wherein said sub-atmospheric pressure space is defined by a soldering device with said solder nozzle for producing said soldering wave, and a mask frame accommodating the second means spaced from the solder nozzle tightly seated upon the same and provided with an arrangement for producing under-pressure.

3. Apparatus according to claim 2, wherein said mask frame is mounted to be raised and lowered, and has an opening for a mask insert which is removable and in turn is capable of removably accommodating the second means.

4. Apparatus according to claim 3, wherein said second-mentioned means is composed of steel having a soft-iron wall surface.

5. Apparatus according to claim 3, wherein said mask frame and said mask insert are of epoxy resin.

6. Apparatus according to claim 3; and further comprising above said marking insert a marking projector for directing against the component to be desoldered a picture thereof so as to mark said component.

* * * * *